United States Patent
Lee et al.

(10) Patent No.: US 6,897,688 B2
(45) Date of Patent: May 24, 2005

(54) INPUT/OUTPUT BUFFER HAVING ANALOG AND DIGITAL INPUT MODES

(75) Inventors: Yun-Woo Lee, Kwachon-shi (KR); Dae-Gyu Kim, Gunpo-shi (KR); Boo-Yung Huh, Suwon-shi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/755,299

(22) Filed: Jan. 13, 2004

(65) Prior Publication Data

US 2004/0141392 A1 Jul. 22, 2004

(30) Foreign Application Priority Data

Jan. 13, 2003 (KR) .................................. 10-2003-0002110

(51) Int. Cl.[7] .................................................. H03B 1/00
(52) U.S. Cl. ........................ 327/112; 327/415; 326/83
(58) Field of Search .............................. 327/108, 112, 327/379, 387, 388, 389, 391, 415, 416; 326/21, 26, 27, 82, 83, 86

(56) References Cited

U.S. PATENT DOCUMENTS

| | | | |
|---|---|---|---|
| 5,635,745 A | * | 6/1997 | Hoeld ........................ 257/372 |
| 6,087,887 A | * | 7/2000 | Lim et al. .................... 327/416 |
| 6,509,758 B2 | * | 1/2003 | Piasecki et al. ............... 326/37 |
| 2002/0101272 A1 | * | 8/2002 | Bales et al. ................. 327/310 |
| 2003/0151427 A1 | * | 8/2003 | Piasecki et al. ............... 326/47 |

* cited by examiner

*Primary Examiner*—Tuan T. Lam
(74) *Attorney, Agent, or Firm*—Volentine Francos & Whitt PLLC

(57) ABSTRACT

An input/output buffer is operative in an analog mode and a digital mode. The buffer includes a pad, a digital signal line which includes a transmission gate connected to the pad, an analog signal line connected to the pad, an analog/digital mode controller which sets an output level of the digital signal line in the analog mode, and a transmission gate controller which controls the transmission gate when a signal voltage of the pad exceeds a reference voltage.

17 Claims, 2 Drawing Sheets

INPUT/OUTPUT BUFFER HAVING ANALOG AND DIGITAL INPUT MODES

BACKGROUND OF THE INVENTION

1. Field of the Invention

The present invention generally relates to semiconductor integrated circuits, and more particularly, the present invention relates to an input/output buffer having analog and digital input modes.

2. Description of the Related Art

In order for a semiconductor device to support multimedia applications which include video and audio processing, it is necessary that the device be equipped to handle both analog and digital signaling formats. Recently, mixed integrated circuits (mixed IC's) have been developed in which analog and digital circuits are embedded in one chip so as to provide single-chip multimedia processing. In a mixed IC, signals are of different types are transmitted and/or received through separate signal pads. For example, analog signals may be input/output on one signal pad, and digital signals input/output on another signal pad. Unfortunately, however, the use of multiple pads in this manner results in an increase in the overall area occupied by the chip. This makes it difficult to achieve levels of miniaturization generally demanded in the semiconductor industry.

SUMMARY OF THE INVENTION

According to one aspect of the present invention, an input/output buffer is provided which is operative in an analog mode and a digital mode, and which includes a pad, a digital signal line which includes a transmission gate connected to the pad, an analog signal line connected to the pad, an analog/digital mode controller which sets an output level of the digital signal line in the analog mode, and a transmission gate controller which controls the transmission gate when a signal voltage of the pad exceeds a reference voltage.

According to another aspect of the present invention, an input/output buffer is provided which is operative in an analog mode and a digital mode, and which includes a pad, a digital signal line which includes a first transmission gate connected to the pad, an analog signal line which includes a second transmission gate connected to the pad, an analog/digital mode controller which sets an output level of the digital signal line in the analog mode, and a transmission gate controller which controls the first and second transmission gates when a signal voltage of the pad exceeds a reference voltage.

The digital signal line may further include a first resistor connected between the pad and the transmission gate, an output driver having an output connect to the transmission gate, a Schmitt trigger having an input connected to the transmission gate, and an input driver having an input connected to an output of the Schmitt trigger. The analog signal line may include a second resister connected to the pad.

A constant voltage tolerance unit may be connected to the pad which includes first and second PMOS transistors connected in series between a power supply voltage and the ground voltage, where the first PMOS transistor has a gate connected to the pad and the second PMOS transistor has a gate connected to the power supply voltage.

It is to be understood that both the foregoing general description and the following detailed description of the present invention are exemplary and explanatory and are intended to provide further explanation of the invention as claimed.

BRIEF DESCRIPTION OF THE DRAWINGS

The aspects and features of the present invention will become more readily understood from the detail description that follows, with reference to the accompanying drawings, in which.

DETAILED DESCRIPTION OF THE PREFERRED EMBODIMENTS

Figure 1:
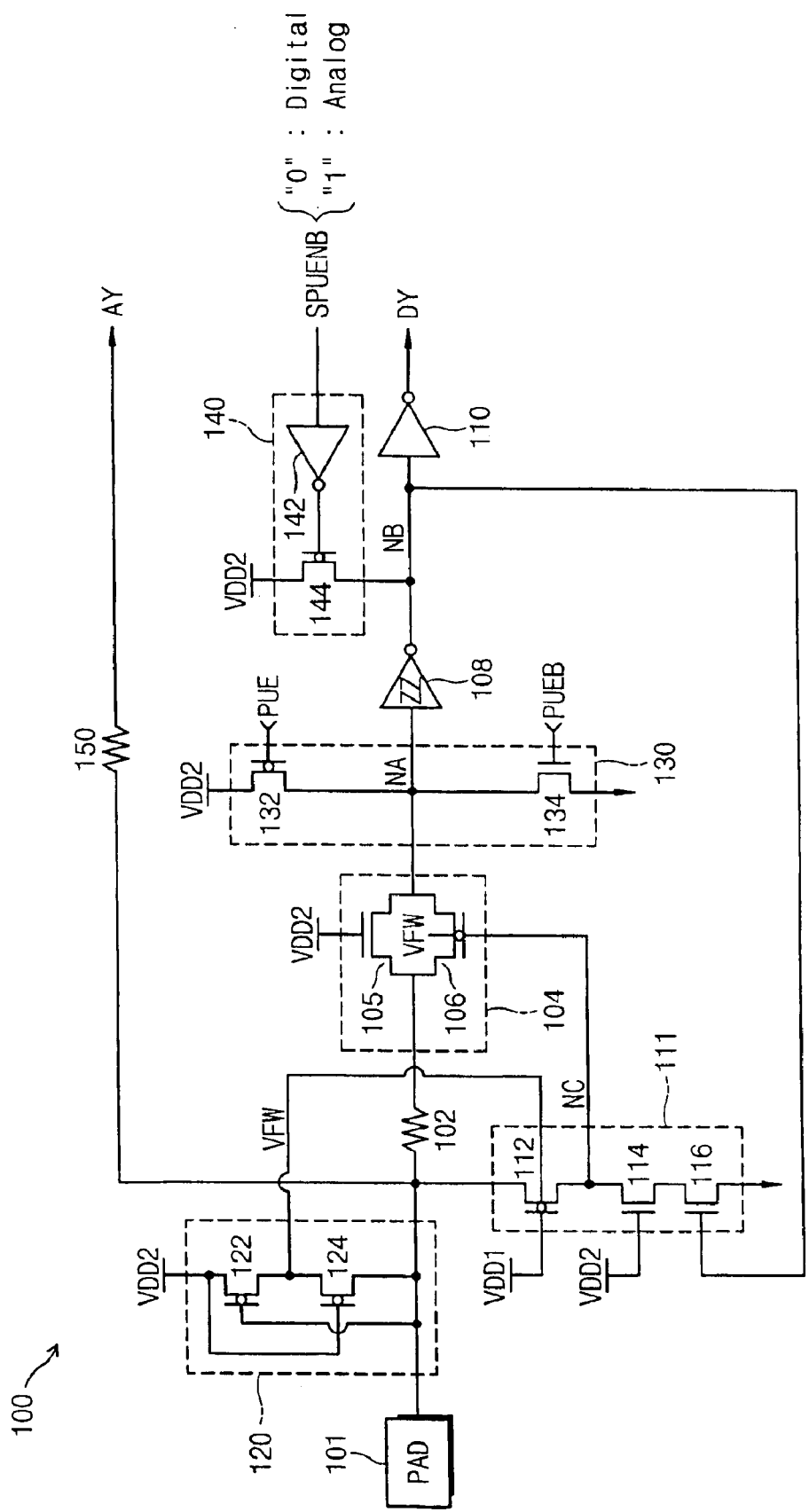
FIG. 1 illustrates an analog/digital input/output circuit according to a first embodiment of the present invention.

Reference will now be made in detail to the preferred embodiments of the present invention, examples of which are illustrated in the accompanying drawings. However, the present invention is not limited to the embodiments illustrated hereinafter, and the embodiments herein are rather introduced to provide easy and complete understanding of the scope and spirit of the present invention. Herein, the same reference numerals represent the same elements. For the convenience of explanation, it is assumed that a first power supply voltage VDD1 is about 1.8 V and a second power supply voltage VDD2 is about 3.3 V.

FIG. 1 illustrates an input/output buffer 100 according to a first embodiment of the present invention. Referring to FIG. 1, the input/output buffer 100 includes a pad 101, a first resistor 102, a transmission gate 104, a Schmitt trigger 108, an input driver 110, a transmission controller 111, a constant voltage tolerant unit 120, an output driver 130, an analog/digital controller 140, and a second resistor 150.

The pad 101 receives an analog or digital input signal, and transmits a digital output signal.

The first resistor 102 is connected between the pad 101 and the transmission gate 104. The first resistor 102 functions as a protection circuit by preventing an electrostatic voltage input via the pad 101 from being transmitted to internal circuitry.

The transmission gate 104 includes an NMOS transistor 105 gated to the second power supply voltage VDD2 and a PMOS transistor 106 gated to a voltage of a node NC, which will be described later. A well bias voltage VFW of the PMOS transistor 106 is provided from the constant voltage tolerant unit 120, which will be described later.

The Schmitt trigger 108 generates an amplitude stabilized digital signal from the signal transferred through the transmission gate 104.

The input driver 110 generates an internal digital signal DY according to an output of the Schmitt trigger 108 to thereby drive an internal digital circuit block (not shown).

The transmission controller 111 is provided with a first PMOS transistor 112, first and second NMOS transistors 114 and 116, which are sequentially connected in series between the pad 101 and a ground voltage VSS. The first PMOS transistor 112 has a gate connected to the first power supply voltage VDD1 and an N well connected to the well bias voltage VFW. The first NMOS transistor 114 has a gate connected to the second power supply voltage VDD2 and the second NMOS transistor 116 has a gate connected to a node NB. Here, the node NB is an output node of the Schmitt trigger 108. A node NC is connected between the first PMOS transistor 112 and the first NMOS transistor 114, and is connected to the PMOS transistor 106 of the transmission gate 104.

The constant voltage tolerant unit 120 includes second and third PMOS transistors 122 and 124 connected in series between the second power supply voltage VDD2 and the pad 101. The second PMOS transistor 122 has a gate connected to the pad 101 and the third PMOS transistor 124 has a gate connected to the second power supply voltage VDD2. Here, a voltage of a node between the second PMOS transistor 122 and the third PMOS transistor 124 is the well bias voltage VFW.

The output driver 130 includes an inverter formed by a PMOS transistor 132 and an NMOS transistor 134 which are connected between the second power supply voltage VDD2 and the ground voltage. The PMOS transistor 132 and the NMOS transistor 134 are gated to a pair of internal signals PUE and PUEB. In a digital output mode, the internal signals PUE and PUEB are outputted to the pad 101 through the output driver 130, the transmission gate 104 and the first resistor 102.

The analog/digital controller 140 sets a voltage level of a node NB to a high level (VVD2) when an analog/digital control signal SPUENB indicates an analog mode. The analog/digital controller 140 includes an inverter 142 receiving the analog/digital control signal SPUENB, and a PMOS transistor 144 provided between the second power supply voltage VDD2 and the node NB and gated to an output of the inverter 142. If the analog/digital control signal SPUENB is a low level a digital mode is indicated, and if the analog/digital control signal SPUENB is a high level an analog mode is indicated.

The second resistor 150 transmits an analog signal AY inputted through the pad 101 to an internal analog circuit block (not shown). Like the first resistor 102, the second resistor 150 serves as the protection circuit.

The operation of the input/output buffer 100 illustrated in FIG. 1 will be now be described.

First, in the analog input mode, an output of the inverter 142 is set to a logic low level in response to a logic high level of the analog/digital control signal SPUENB and the node NB is set to a logic high level corresponding to the second power supply voltage VDD2. Thus, the internal digital signal DY is outputted at a logic low level, and accordingly, the internal digital circuit block (not shown) is not driven. At this time, the node NC becomes a logic low level corresponding to the ground voltage VSS in response to a logic high level of the node NA and the transmission gate 104 is turned on, so that the signal inputted through the pad 101 is transmitted to the nodes NA and NB through the first resistor 102 and the transmission gate 104. However, the signal inputted through the pad 101 is not transmitted as the digital signal DY since the node NB is already set to the logic high level. Therefore, the signal inputted through the pad 101 is generated as an internal analog signal AY through the second resistor 150. The internal analog signal AY drives the internal analog circuit block (not shown) to perform an analog operation of the inner chip.

Second, in the digital input mode, the PMOS transistor 144 of the controller 140 is turned off in response to a logic low level of the analog/digital control signal SPUENB. The signal inputted through the pad 101 is generated as the internal digital signal DY through the first resistor 102, the transmission gate 104, the Schmitt trigger 108 and the output driver 110.

In the digital input mode, if the signal inputted through the pad 101 is a logic low level, the node NB is set to a logic high level and the internal digital signal DY is set to a logic low level. On the other hand, if the digital signal inputted through the pad 101 is a logic high level, the node NB is set to a logic low level and the internal digital signal DY is set to a logic high level. The internal digital signal DY drives the internal digital circuit block (not shown) to perform a digital operation of the chip.

In the meantime, if the signal inputted through the pad has a voltage level (e.g., 5V) that is higher than the second power supply voltage VDD2, the third PMOS transistor 124 of the constant voltage tolerant unit 120 is turned on so that the well bias voltage VFW becomes 5V. This causes the first PMOS transistor 112 of the transmission controller 111 to be turned on, whereby a voltage level of the node NC becomes about 5V. Accordingly, the PMOS transistor 106 of the transmission gate 104 is turned off. In this state, when the 5 V inputted through the pad 101 is transmitted as the internal digital signal through the NMOS transistor 105 of the transmission gate 104. A voltage level at the node NA thus becomes a voltage which is dropped by as much as a threshold voltage (Vth) of the NMOS transistor 105, i.e., 3.3 V-Vth. In this manner, if a voltage which is higher than the second power supply voltage VDD2 is inputted through the pad 101, the high input voltage is dropped down to the about second power supply voltage VDD2 and the dropped voltage is transmitted to the internal circuit block. Thus, transistors of the internal circuit are protected from a high voltage stress.

Third, in the digital output mode, a logic level of the node NA is determined by the pair of internal signals PUE and PUEB and is transmitted to the pad 101 through the transmission gate 104 and the first resistor 102.

The input/output buffer 100 according to this embodiment of the present invention receives an analog or digital signal through the pad 101 to transmit the signal as the internal analog signal AY and the internal digital signal DY. Also, the input/output buffer 100 outputs a digital signal to the pad 101 in response to the pair of internal signals PUE and PUEB.

Figure 2:
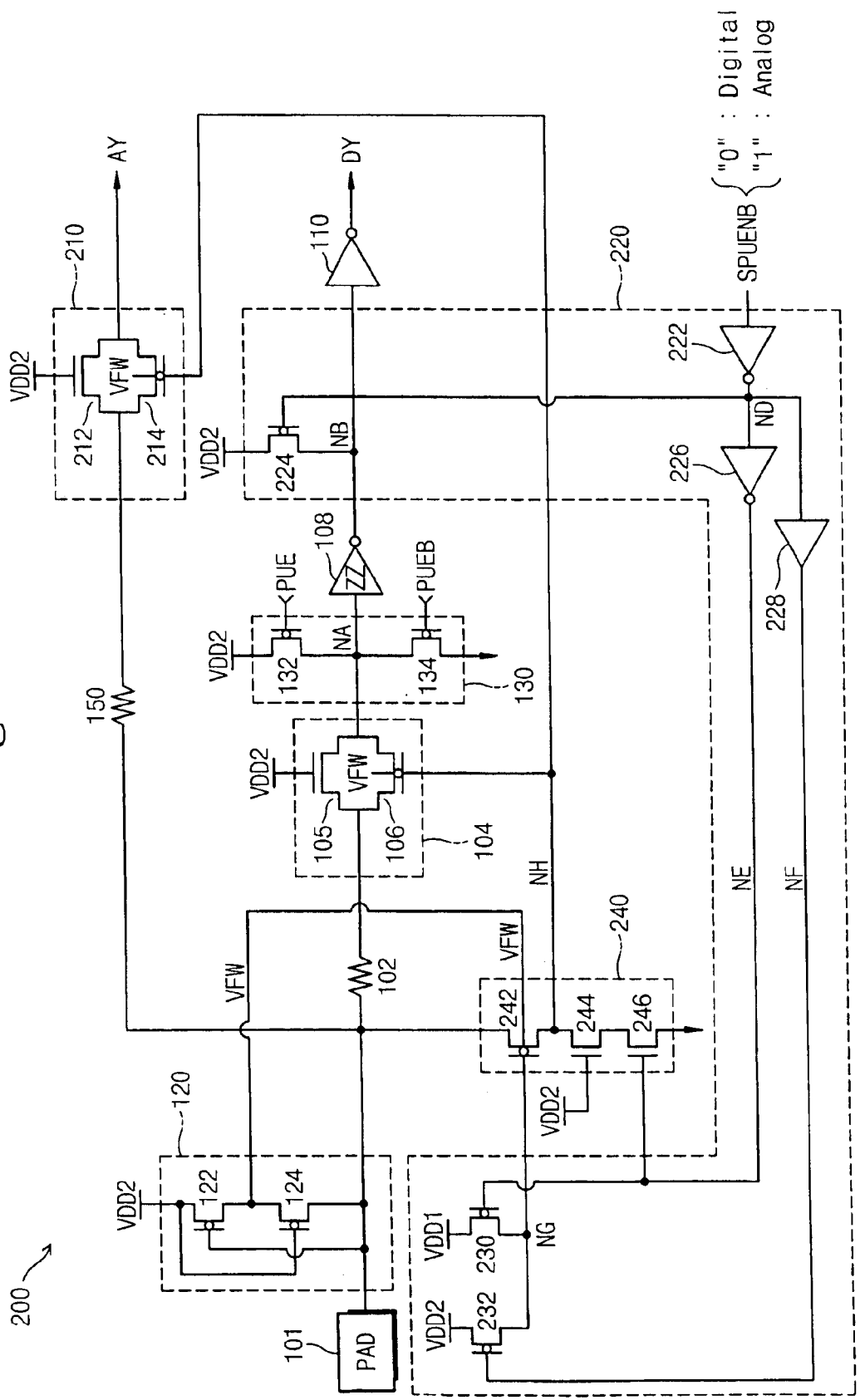
FIG. 2 illustrates an analog/digital input/output circuit according to a second embodiment of the present invention.

FIG. 2 is a circuit diagram of an input/output buffer according to a second embodiment of the present invention. Referring to FIG. 2, the input/output buffer 200 includes a pad 101, a first resistor 102, a first transmission gate 104, a Schmitt trigger 108, an input driver 110, a constant voltage tolerant unit 120, an output driver 130, a second resistor 150, a second transmission gate 210, an analog/digital controller 220, and a transmission controller 240.

The pad 101, the first resistor 102, the first transmission gate 104, the Schmitt trigger 108, the internal driver 110, the voltage tolerant unit 120, the output driver 130 and the second resistor 150 are the same as those of the input/output buffer 100 shown in FIG. 1, and accordingly, a detailed description of these items is omitted here to avoid duplicate explanations.

The second transmission gate 210 is provided with an NMOS transistor 212 responsive to the second power supply voltage VDD2 and a PMOS transistor 214 responsive to a voltage level of a node NH which will be described later. An analog signal inputted through the pad 101 is generated as an internal analog signal AY through the second resistor 150 and the second transmission gate 210.

The analog/digital controller 220 includes first and second inverters 222 and 226, first to third PMOS transistors 224, 230 and 232, and a level shifter 228. The first inverter 222 receives an analog/digital control signal SPUENB and outputs a signal to a node ND. The first PMOS transistor 224 is gated to a voltage level of the node ND and sets a voltage level of the node NB to VDD2 when node ND is logic 0

(low). The second inverter 226 is connected at its input to the node ND and at its output to a node NE, and the level shifter 228 is connected at its input to the node ND and at its output to a node NF. The level shifter 228 shifts an amplitude swing of the analog/digital control signal SPUENB from 0V to the first power supply voltage VDD1 into an amplitude swing of 0V to the second power supply voltage VDD2. The second PMOS transistor 230 is gated to a voltage level of the node NE and the third PMOS transistor 232 is gated to a voltage level of the node NF to determine a voltage level of the node NG.

The transmission controller 240 includes a first PMOS transistor 242, and first and second NMOS transistors 244 and 246, which are sequentially connected in series between the pad 101 and the ground voltage VSS. The first PMOS transistor 242 is gated to a voltage level of the node NG, the first NMOS transistor 244 is gated to the second power supply voltage VDD2, and the second NMOS transistor 246 is gated to a voltage level of the node NE. The node NH between the first PMOS transistor 242 and the first NMOS transistor 244 is connected to a gate of the PMOS transistor 106 contained in the first transmission gate 104 and a gate of the PMOS transistor 214 contained in the second transmission gate 210. Wells of the PMOS transistors 106 and 214 are connected to the well bias voltage VFW.

An operation of the input/output buffer 200 according to the second embodiment of the present invention will be described below.

In an analog input mode, the node ND is set to a logic low level in response to a logic high level of the analog/digital control signal SPUENB, and thus the PMOS transistor 224 is turned on and the node NB becomes a logic high level corresponding to the second power supply voltage VDD2. The internal digital signal DY is set to a logic low level in response to the logic high level of the node NB, so that an internal digital circuit block (not shown) is not driven. The signal inputted through the pad 101 is generated as an internal analog signal AY through the second resistor 150 and the second transmission gate 210. At this time, a logic low level of the node NH is applied to a gate of the PMOS transistor 214 contained in the second transmission gate 210, so that the PMOS transistor 214 is turned on. Therefore, a logic high level signal inputted through the pad is fully transmitted as an internal analog signal AY without any loss of threshold voltage (Vth) of the PMOS transistor 214. The internal analog signal AY drives an internal analog circuit block (not shown).

In a digital input mode, the node ND is set to a logic high level in response to a logic low level of the analog/digital control signal SPUENB, so that the PMOS transistor 224 is turned off. The signal inputted through the pad 101 is generated as the internal digital signal DY through the first resistor 102, the first transmission gate 104, the Schmitt trigger 108 and the input driver 110. Also, the logic high level of the node ND sets the node NE to a logic low level, and the node NF is set to a logic high level which is level-shifted to the second power supply voltage VDD2. In response to the logic low level of the node NE, the second NMOS transistor 246 is turned off and the second PMOS transistor 230 is turned on. The node NG becomes a logic high level corresponding to the first power supply voltage VDD1, so that the PMOS transistor 242 of the transmission controller 240 is turned off. Accordingly, the node NH is floated and has a previous state. A signal level inputted through the pad 101 may be changed while passing through the first transmission gate 104 according to the previous state voltage level of the node NH. At the worst, the node NA may be set to a voltage level which is dropped from a logic high level of the second power supply voltage VDD2, which is inputted through the pad 101, by as much as a threshold voltage (Vth) of the PMOS transistor 106.

If the signal inputted through the pad is a voltage level (e.g., about 5 V) which is higher than the second power supply voltage VDD2, the third PMOS transistor 124 of the constant voltage tolerance unit 120 is turned on, so that the well bias voltage VFW becomes 5V. The first PMOS transistor 242 of the transmission gate controller 240 is turned on, so that the node NH becomes almost 5V. Accordingly, the PMOS transistor 106 of the transmission gate 104 is turned on, and the 5V signal inputted through the pad 101 is transmitted as the internal digital signal DY through the NMOS transistor 105. At this time, the node NA is set to a voltage level which is dropped from the second power supply voltage VDD2 by as much as a threshold voltage (Vth) of the NMOS transistor 105, i.e., 3.3 V-Vth. That is, if a voltage which is higher than the second power supply voltage VDD2 is inputted through the pad 101, the high voltage signal is prevented from being transmitted to the internal circuit block since it is dropped down to the about second power supply voltage VDD2. Thus, transistors of the internal circuit are protected from a high voltage stress.

In a digital output mode, a logic level of the node NA is set by a pair of internal signals PUE and PUEB and is transmitted to the pad 101 through the transmission gate 104 and the first resistor 102.

The input/output buffer 200 according to this embodiment of the present invention receives an analog or digital signal through the pad 101 to transmit the signal as the internal analog signal AY and the internal digital signal DY. Also, the input/output buffer 200 outputs a digital signal to the pad 101 in response to the pair of internal signals PUE and PUEB.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An input/output buffer operative in an analog mode and a digital mode, comprising:
   a pad;
   a digital signal line which includes a transmission gate connected to the pad;
   an analog signal line connected to the pad;
   an analog/digital mode controller which sets an output level of the digital signal line in the analog mode;
   a transmission gate controller which controls the transmission gate when a signal voltage of the pad exceeds a reference voltage.

2. The input/output buffer of claim 1, wherein the digital signal line further includes a first resistor connected between the pad and the transmission gate, an output driver having an output connect to the transmission gate, a Schmitt trigger having an input connected to the transmission gate, and an input driver having an input connected to an output of the Schmitt trigger.

3. The input/output buffer of claim 2, wherein the analog signal line includes a second resister connected to the pad.

4. The input/output buffer of claim 3, further comprising a constant voltage tolerance unit connected to the pad, wherein the constant voltage tolerance unit includes first and second PMOS transistors connected in series between a power supply voltage and the ground voltage, the first PMOS transistor having a gate connected to the pad and the second PMOS transistor having a gate connected to the power supply voltage.

5. The input/output buffer of claim 4, wherein the power supply voltage is a second power supply voltage, and wherein the transmission gate controller includes:
   a third PMOS transistor having a source connected to the pad and a gate connected to a first power supply voltage, and receiving a well bias voltage from a connection node of the first and second PMOS transistors of the constant voltage tolerance unit;
   a first NMOS transistor having a drain connected to a drain of the third PMOS transistor and a gate connected to the second power supply voltage; and
   a second NMOS transistor having a drain connected to a source of the first NMOS transistor, a source connected to the ground voltage, and a gate connected to the output of the Schmitt trigger.

6. The input/output buffer of claim 5, wherein the transmission gate includes:
   a third NMOS transistor connected between the first resistor and the Schmitt trigger and gated to the second power supply voltage; and
   a fourth PMOS transistor connected between the first resistor and the Schmitt trigger and gated to the drain of the third PMOS transistor, and receiving the well bias voltage from the connection node of the first and second PMOS transistors of the constant voltage tolerance unit.

7. The input/output buffer of claim 2, wherein the output driver comprises a PMOS transistor and an NMOS transistor, which are connected in series between a power supply voltage and the ground voltage, the PMOS transistor and the NMOS transistor having gates connected to an internal output signal and a complementary internal output signal, and drains connected between the transmission gate and the Schmitt trigger.

8. The input/output buffer of claim 2, wherein the analog/digital mode controller comprises:
   an inverter which receives an analog/digital control mode signal; and
   a PMOS transistor connected between a power supply voltage and the output of the Schmitt trigger and gated to an output of the inverter.

9. An input/output buffer operative in an analog mode and a digital mode, comprising:
   a pad;
   a digital signal line which includes a first transmission gate connected to the pad;
   an analog signal line which includes a second transmission gate connected to the pad;
   an analog/digital mode controller which sets an output level of the digital signal line in the analog mode;
   a transmission gate controller which controls the first and second transmission gates when a signal voltage of the pad exceeds a reference voltage.

10. The input/output buffer of claim 9, wherein the digital signal line further includes a first resistor connected between the pad and the first transmission gate, an output driver having an output connect to the first transmission gate, a Schmitt trigger having an input connected to the first transmission gate, and an input driver having an input connected to an output of the Schmitt trigger.

11. The input/output buffer of claim 10, wherein the analog signal line further includes a second resister connected between the pad and the second transmission gate.

12. The input/output buffer of claim 11, further comprising a constant voltage tolerance unit connected to the pad, wherein the constant voltage tolerance unit includes first and second PMOS transistors connected in series between a power supply voltage and the ground voltage, the first PMOS transistor having a gate connected to the pad and the second PMOS transistor having a gate connected to the power supply voltage.

13. The input/output buffer of claim 12, wherein the power supply voltage is a second power supply voltage, and wherein the analog/digital controller comprises:
   a first inverter which receives an analog/digital control mode signal;
   a third PMOS transistor connected between the second power supply voltage and an output of the Schmitt trigger and gated to an output of the first inverter;
   a second inverter which receives an output of the first inverter;
   a level shifter which shifts an amplitude swing of the output of the first inverter;
   a fourth PMOS transistor having a source connected to a first power supply voltage and a gate connected to an output of the second inverter; and
   a fifth PMOS transistor having a source connected to the second power supply voltage, a drain connected to a drain of the fourth PMOS transistor, and a gate connected to an output of the level shifter.

14. The input/output buffer of claim 13, wherein the transmission gate controller comprises:
   a sixth PMOS transistor connected to a well bias voltage and having a source connected to the pad and a gate connected to the drain of the fourth PMOS transistor of the analog/digital controller;
   a first NMOS transistor having a drain connected to a drain of the sixth PMOS transistor and a gate connected to the second power supply voltage; and
   a second NMOS transistor having a drain connected to a source of the first NMOS transistor, a source connected to the ground voltage, and a gate connected to the output of the second inverter of the analog/digital controller.

15. The input/output buffer of claim 14, wherein the first transmission gate comprises:
   a third NMOS transistor connected between the first resistor and the Schmitt trigger and gated to the second power supply voltage; and
   a seventh PMOS transistor connected to the well bias voltage and connected between the first resistor and the Schmitt trigger and gated to the drain of the sixth PMOS transistor of the transmission gate controller.

16. The input/output buffer of claim 14, wherein the second transmission gate includes:
   a third NMOS transistor connected between the second resistor and an internal analog signal node and gated to the second power supply voltage; and
   a seventh PMOS transistor connected to the well bias voltage and connected between the second resistor and the internal analog signal node and gated to the drain of the first PMOS transistor of the transmission gate controller.

17. The input/output buffer of claim 10, wherein the output driver comprises a PMOS transistor and an NMOS transistor, which are connected in series between a power supply voltage and the ground voltage, the PMOS transistor and the NMOS transistor having gates connected to an internal output signal and a complementary internal output signal, and drains connected between the transmission gate and the Schmitt trigger.

* * * * *